United States Patent
Kearney et al.

(10) Patent No.: US 8,467,748 B2
(45) Date of Patent: Jun. 18, 2013

(54) WIRELESS COMMUNICATION UNIT, INTEGRATED CIRCUIT COMPRISING A VOLTAGE CONTROLLED OSCILLATOR AND METHOD OF OPERATION THEREFOR

(75) Inventors: Niall Kearney, Dublin (IE); Wayne Shepherd, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 879 days.

(21) Appl. No.: 12/529,523

(22) PCT Filed: Mar. 2, 2007

(86) PCT No.: PCT/IB2007/050687
§ 371 (c)(1),
(2), (4) Date: Sep. 1, 2009

(87) PCT Pub. No.: WO2008/107736
PCT Pub. Date: Sep. 12, 2008

(65) Prior Publication Data
US 2010/0097110 A1   Apr. 22, 2010

(51) Int. Cl.
*H01Q 11/12*   (2006.01)
(52) U.S. Cl.
USPC .......................................... 455/118; 455/255
(58) Field of Classification Search
USPC ........................................................ 455/118
See application file for complete search history.

(56) References Cited

U.S. PATENT DOCUMENTS

| | | | |
|---|---|---|---|
| 5,021,754 A | 6/1991 | Shepherd et al. | |
| 5,166,642 A | 11/1992 | Hietala | |
| 6,157,271 A * | 12/2000 | Black et al. | 332/127 |
| 6,566,966 B1 | 5/2003 | Bellaouar et al. | |
| 6,674,333 B1 | 1/2004 | Peckham et al. | |
| 7,099,643 B2 * | 8/2006 | Lin | 455/255 |
| 7,772,934 B2 * | 8/2010 | Vancorenland et al. | 331/179 |
| 7,974,374 B2 * | 7/2011 | Groe et al. | 375/376 |
| 2005/0258907 A1 | 11/2005 | Zachan et al. | |

FOREIGN PATENT DOCUMENTS

| | | |
|---|---|---|
| EP | 1657812 A1 | 5/2006 |
| EP | 1538742 A1 | 6/2008 |

OTHER PUBLICATIONS

PCT/IB2007/050687 International Search Report and Written Opinion mailed Dec. 12, 2007.
Neurauter, B. et al.; "GSM 900/DCS 1800 Fractional-N Modulator with Two-Point-Modulation"; 2002 IEEE MTT-S Digest; 2002; pp. 425-428; IEEE.
Ishikuro, Hiroki et al.; "A Single-Chip CMOS Bluetooth Transceiver with 1.5MHz IF and Direct Modulation Transmitter"; 2003 International Solid-State Circuits Conference; 2003; 10 pgs; IEEE.

* cited by examiner

*Primary Examiner* — Ajibola Akinyemi (57) ABSTRACT

A wireless communication unit comprises a frequency generation circuit employing a phase locked loop (PLL) circuit comprising a voltage controlled oscillator having a modulation port for directly modulating a signal output from the voltage controlled oscillator. The voltage controlled oscillator is operably coupled to at least one switch and a capacitor bank comprising one or more varactors. A controller is arranged to switch in one or more varactors associated with the modulation port of the phase locked loop circuit to provide an inverse cubic relationship to the direct modulated signal.
In addition, or alternatively, the phase locked loop (PLL) circuit may comprise a voltage controlled oscillator having a tuning port for controlling a frequency of a signal output from the voltage controlled oscillator. The controller here is arranged to switch in one or more varactors associated with the tuning port of the phase locked loop circuit in an inverse square relationship.

15 Claims, 8 Drawing Sheets

WIRELESS COMMUNICATION UNIT, INTEGRATED CIRCUIT COMPRISING A VOLTAGE CONTROLLED OSCILLATOR AND METHOD OF OPERATION THEREFOR

TECHNICAL FIELD

The technical field relates to frequency generation circuits for wireless communication units. The technical field is applicable to, but not limited to, single and dual tuning port voltage controlled oscillators (VCOs), wherein a first tuning port is used to primarily tune the VCO in a phase locked loop (PLL), and a second tuning port (if present) is used to phase/frequency modulate a VCO output.

BACKGROUND OF THE INVENTION

Transceiver circuits often employ phase locked loops (PLLs) as frequency synthesizers to provide local oscillator (LO) signals for the frequency conversion (mixing) operations involved in transmitting modulated data and demodulating received data, in addition to use in general clock generation circuits.

Frequency synthesisers have been developed in recent years that permit direct modulation of a carrier signal generated by a Phase Locked Loop (PLL) circuit by rapidly varying the instantaneous value of a variable divider forming part of the PLL circuit. The variable divider is controlled by a digital signal output from a sigma-delta type multi-accumulator digital circuit, which acts to shape the noise generated by such a system. Noise is primarily generated at higher frequencies where it can be more easily filtered out (by the natural Low Pass Filter behavior of a closed-loop phase locked loop (PLL)) before transmission of the signal. Such frequency synthesisers are known as direct modulation multi-accumulator fractional-N synthesisers and examples of such a synthesiser is described in U.S. Pat. Nos. 5,166,642 and 5,021,754.

Figure 1:
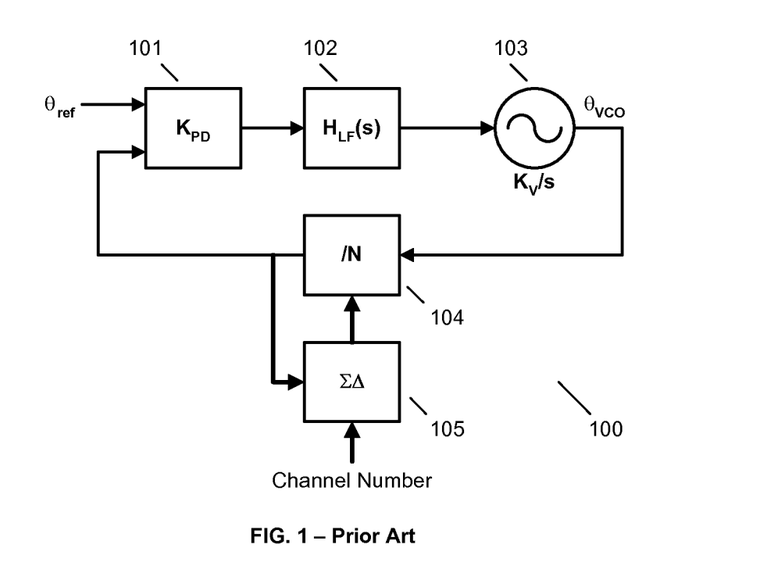
FIG. 1 shows a block diagram of a known structure of a fractional-N PLL.

Many types of PLL exist, one widely used PLL circuit being the fractional-N synthesizer incorporating sigma-delta techniques. A structure of a known fractional-N PLL 100 is shown in FIG. 1. The fractional-N PLL circuit 100 consists of a reference frequency (often generated by a crystal oscillator), a phase detector 101, a loop filter 102, a voltage controlled oscillator (VCO) 103, a programmable feedback divider 104, and a sigma-delta modulator 105. A function of the sigma-delta modulator 105 is to control an average divide ratio of the feedback divider 104 to allow frequencies to be synthesized that are not integer multiples of the phase detector operating frequency. This allows the PLL to be designed to have wider bandwidth, faster settling time and exhibit lower noise levels.

The sigma-delta modulator 105 introduces quantization noise in the loop. This quantization noise is shaped by the design of the sigma-delta modulator 105, such that in-band noise is usually moved to higher frequencies. Thus, one of the design considerations for the loop filter is attenuation of the quantization noise at higher frequencies.

The transfer function of the PLL may be represented by:

$$\frac{\theta_{VCO}}{\theta_{ref}} = \frac{N}{1 + \frac{s}{K_{PD} H_{LF}(s) \left(\frac{K_V}{N}\right)}} \qquad [1]$$

where:
$K_{PD}$ is the gain of the phase detector,
$H_{LF}(s)$ is the transfer function of the loop filter,
$K_V$ is the gain of the VCO, and
1/N is the transfer function of the feedback divider.

It can be seen that if $K_{PD}$ is fixed, and pole locations of the loop filter are also fixed, then the dynamics and noise performance of the loop will vary as both $K_V$ and N vary with frequency.

The known prior art has countered this phenomenon by making $K_{PD}$ programmable depending on the frequency being synthesized. While this option readily lends itself to charge pump based designs, it is not an attractive option for other types of phase detector—for example the voltage mode XOR, where the gain is given by $V_{DD}/\pi$, where Vdd is the supply voltage. Here the available output voltage range would be significantly compromised if, say, $V_{DD}$ was made programmable in an analogous fashion.

Figure 2:
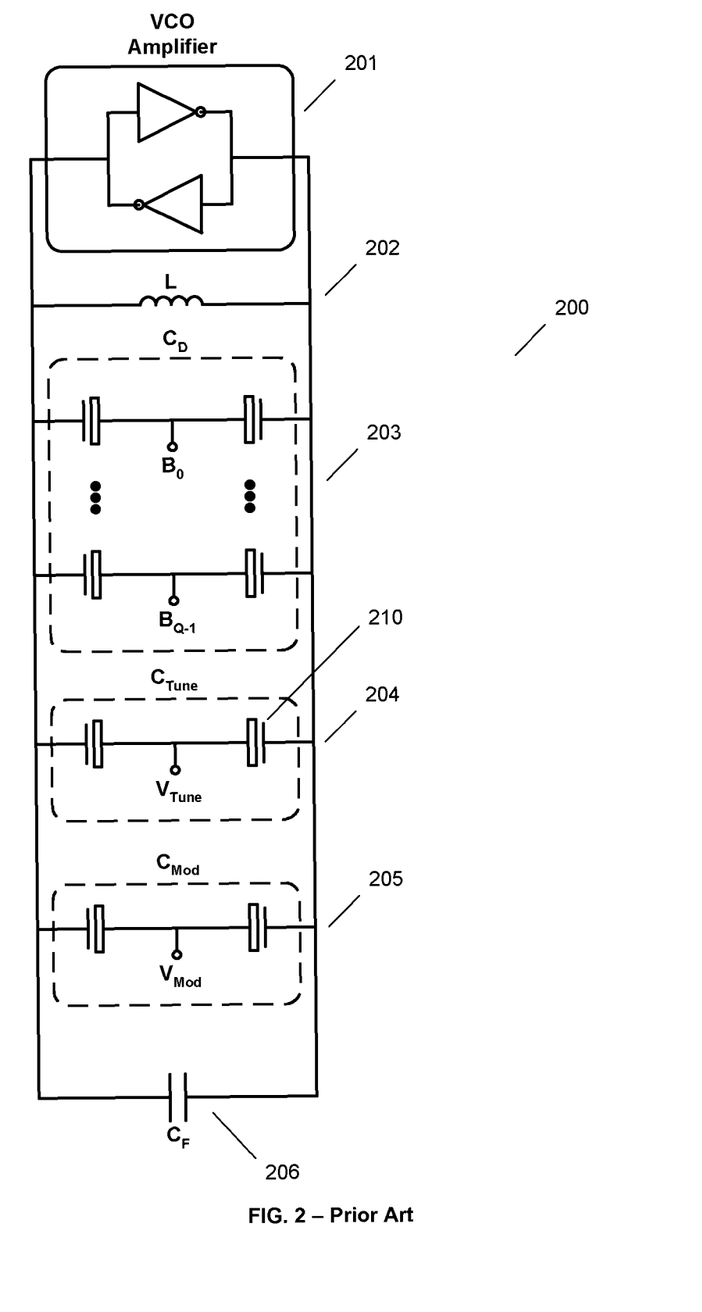
FIG. 2 shows a structure of a known CMOS VCO topology incorporating band switching, with PLL tuning port and optional modulation control port.

A structure of a widely used band-switched VCO 200 is shown in FIG. 2. The band-switched VCO 200 consists of a parallel connection of an amplifier 201, inductor 202, digitally tuned capacitor back 203, analogue tuning line voltage controlled capacitor 204, modulation voltage controlled capacitor 205 (if provided), and fixed capacitance 206, which represents parasitic and loading capacitances present in the circuit. Sufficient performance is achieved with this and similar topologies in standard CMOS technologies to provide competitive low cost solutions for mobile handsets serving the Global System for Mobile communications (GSM) and third generation (3G) cellular phone markets, for example.

The frequency of oscillation is well approximated by:

$$\omega = \frac{1}{\sqrt{L \cdot C}} \qquad [2]$$

where:
ω is the frequency of oscillation,
L is the tank inductance, and
C is the total tank capacitance.

Capacitive varactor elements 210 are typically employed so that control of the applied voltage to the varactor can be used to adjust the oscillation frequency, as it is difficult to produce variable inductance in standard processes without degrading a quality factor, and hence impacting performance. The varactor structure may take several forms, an example of which is the MOS capacitor, the capacitance of which may be continuously varied from a maximum value when the device is in accumulation mode, to a minimum capacitance value when the device is operating in a depletion region. Thus, capacitance is a function of the applied bias voltage, and hence oscillation frequency is a function of this applied voltage.

The sensitivity of oscillation frequency to this control voltage is $K_V$, and may be expressed as:

$$K_V = \frac{\partial \omega}{\partial V_{Tune}} = -\frac{\omega^3 L}{2} \cdot \frac{\partial C_{Tune}}{\partial V_{Tune}} \qquad [3]$$

where:
$C_{Tune}$ represents a portion of the tank capacitance that is controlled by the PLL tuning line voltage, $V^{Tune}$.

By employing digitally tuned band-switching techniques, the PLL loop filter operating point may be set to be very close to a desired voltage, say a mid range value. At this mid range tuning line voltage, it can be seen that $K_V$ varies as a cube of oscillation frequency as one moves from band to band, and this causes variations in dynamics and noise performance of the conventional PLL incorporating such a VCO across the tuning range.

Figure 3:
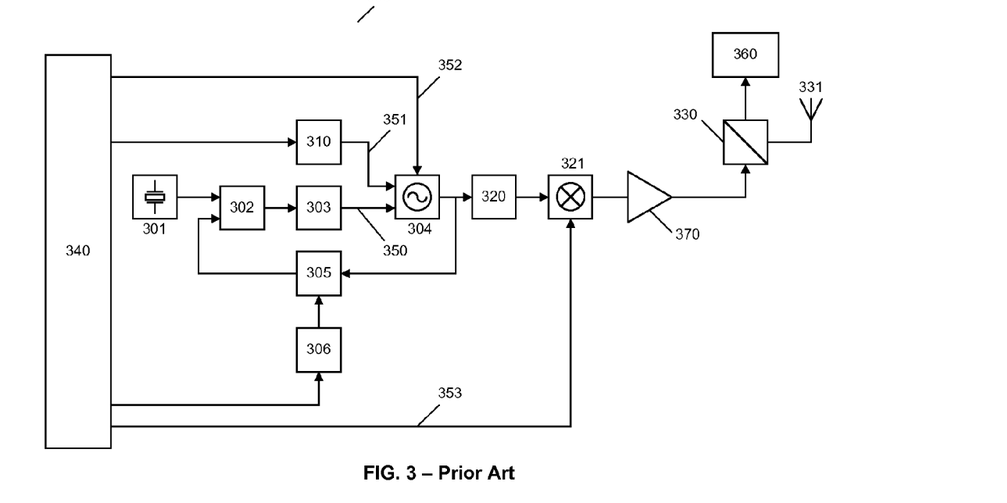
FIG. 3 illustrates a block diagram of a known transceiver device comprising a fractional-N synthesizer.

An example of a known fractional-N PLL, in a transmit portion of a transceiver device 300, is shown in FIG. 3. The fractional-N PLL consists of crystal reference 301, phase detector 302, loop filter 303, voltage controlled oscillator 304 with tuning line voltage 350, modulation port 351 and digital tuning port 352, programmable feedback divider 305, sigma-delta modulator 306, digital-to-analogue converter 310, frequency divider 320, mixer 321, power amplifier 370, antenna switch/duplexer 330, antenna 331 and receiver 360. This configuration is well known in the art and will therefore not be described further here.

Digital data for transmission is added to an input of a sigma-delta modulator 306, which controls the fractional-N divide value. The overall transfer function from the input of the sigma-delta modulator 306 to an output of the VCO, is low-pass in nature, and, especially for digital modulation schemes requiring wide bandwidths, the low-pass nature of this response will tend to attenuate and distort higher frequency components of the transmit data.

Whilst it is desirable to widen the bandwidth of the loop to counter this effect, it is not always practical to do so, as it would reduce rejection of fractional-N quantization noise, as well as exhibiting other undesirable effects.

One known solution to this problem also illustrated in FIG. 3, is to pass the higher frequency components of the transmit data to an output of the VCO 304 via an additional tuning port in the VCO—commonly referred to as the modulation port 351. With knowledge of the loop parameters and transfer functions, appropriate signal processing on the transmit data can be performed in the digital domain, such that the combined effect of the two paths produces the required phase modulation at the output of the VCO 304. Amplitude modulation (AM) may be added (depending on the modulation scheme) via AM path 353 and mixer 321.

Now, referring back to FIG. 2 with the additional modulation port varactors 205 present, modulation port sensitivity may be defined as:

$$K_{Mod} = \frac{\partial \omega}{\partial V_{Mod}} = -\frac{\omega^3 L}{2} \cdot \frac{\partial C_{Mod}}{\partial V_{Mod}} \quad [4]$$

where:

$K_{Mod}$ is the modulation port gain, and $C_{Mod}$ is the portion of the tank capacitance controlled by the modulation port voltage, $V_{Mod}$. Note that this expression has the same form as equation [3], arising from the similar varactor tuning mechanism.

This modulation port gain varies as the cube of frequency, and its value is a key parameter for the application of additional VCO frequency/phase modulation and its resulting fidelity Thus, a need exists for an improved wireless communication unit, an integrated circuit comprising a frequency generation circuit and method of operation therefor.

SUMMARY OF THE INVENTION

In accordance with embodiments of the invention, there is provided a wireless communication unit, an integrated circuit and a method of generating a radio frequency signal, as defined in the appended Claims.

BRIEF DESCRIPTION OF THE DRAWINGS

Exemplary embodiments of the invention will now be described, by way of example only, with reference to the accompanying drawings, in which.

DESCRIPTION OF EMBODIMENTS OF THE INVENTION

Figure 4:
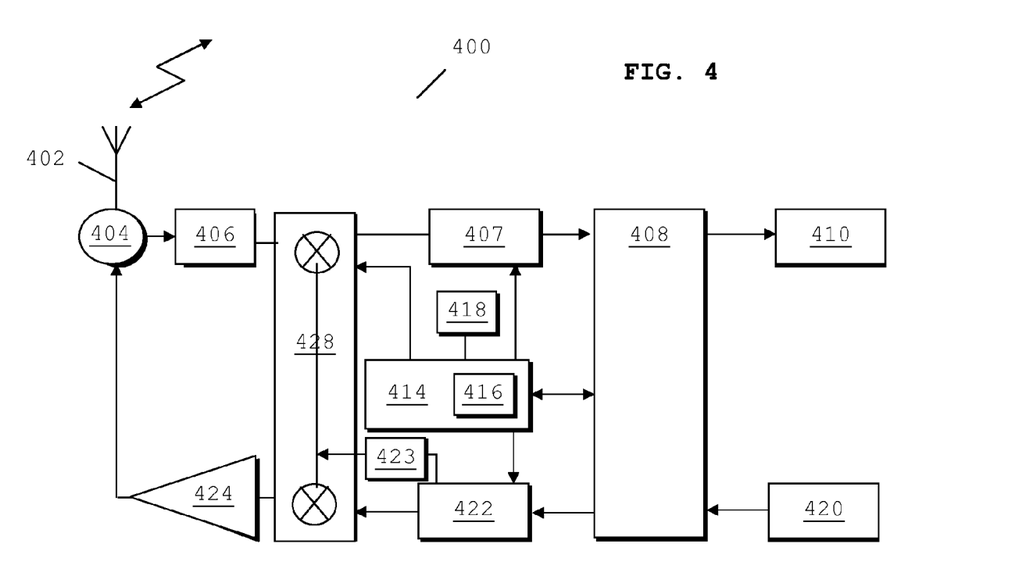
FIG. 4 illustrates a block diagram of a transceiver device comprising a fractional-N synthesizer adapted according to embodiments of the invention.

A block diagram of a wireless subscriber communication unit (often termed mobile station (MS)) 400 adapted according to embodiments of the invention is illustrated in FIG. 4. The MS 400 is adapted to support the inventive concept of the preferred embodiment of the present invention. The MS 400 contains an antenna 402 preferably coupled to a duplex filter or antenna switch 404 that provides isolation between receive and transmit chains within the MS 400.

The receiver chain includes receiver front-end circuitry 406 (effectively providing reception, amplification and filtering of a received signal). The received signal is input to a frequency conversion circuit 428 that receives a reference oscillator signal from the frequency generation circuit 423. The frequency conversion circuit 428 preferably comprises mixing and amplifier elements (not shown), as known in the art. The frequency conversion circuit 428 is serially coupled to a signal processing function (generally realised by a digital signal processor (DSP)) 408 via a baseband (back-end) processing circuit 407.

A controller 414 is operably coupled to the frequency generation circuit 423 and/or frequency conversion circuit 428. A memory device 416 stores a wide array of MS-specific data, for example decoding/encoding functions, frequency and timing information for the communication unit, etc. A timer 418 is operably coupled to the controller 414 to control the timing of operations, namely the transmission or reception of time-dependent signals, within the MS 400. As known in the art, received signals that are processed by the signal processing function are typically input to an output device 410, such as a speaker or liquid crystal display (LCD).

The transmit chain essentially includes an input device 420, such as a microphone, coupled in series through a processor 408, transmitter/modulation circuitry 422, frequency generation/conversion circuit 428 and a power amplifier 424. The processor 408, transmitter/modulation circuitry 422 and the power amplifier 424 are operationally responsive to the controller. An output from the power amplifier is coupled to the duplex filter or antenna switch 404, as known in the art.

In accordance with one embodiment of the present invention, the radio frequency generation circuit 423 has been adapted to vary the tuning varactor of the oscillator's modulation port as a function of oscillation frequency in discrete steps, approximating an inverse cube relationship.

In accordance with one embodiment of the present invention, this tuning scheme specifically bounds, by design, the $K_{Mod}$ variation at the mid-point of the tuning characteristics, as described later with respect to FIG. 8. $K_{Mod}$ variations of individual sub-bands depend on the actual varactor fabrication process.

In accordance with one embodiment of the present invention, the radio frequency generation circuit 423 has been adapted to vary the varactor of the oscillator's tuning port as a function of oscillation frequency in discrete steps, approximating an inverse square relationship.

In accordance with one embodiment of the present invention, this tuning scheme specifically bounds, by design, the $K_V/N$ variation at the mid-point of the tuning characteristics, as described later with respect to FIG. 5.

Of course, the various components within the wireless communication unit 400 may be realised in discrete or integrated component form. Furthermore, it is within the contemplation of the invention that the wireless communication unit 400 may be any wireless communication unit, such as a portable phone, a portable or mobile radio, a personal digital assistant, a wireless laptop computer, etc.

One embodiment of the present invention is described with reference to a dual tuning port voltage controlled oscillator (VCO) in a MS 400. However, it is envisaged that the inventive concept herein described is equally applicable to a large class of VCO designs, placed in any known phase locked loop (PLL) arrangement, including, but not limited to, integer PLLs, fractional-N based PLLs, charge pump based PLLs and XOR based PLLs. In particular, the mathematical functions described below are valid for any parallel inductor-capacitor (L-C) tank arrangement. Employing known circuit theory, it is envisaged that the inventive concept (and mathematical formulae) is/are also applicable to any series type L-C tank, albeit that the equations may change but the concept remains.

Advantageously, this process facilitates a reduction in die area as well as reducing cost for the customer in terms of factory phasing and component count.

In particular it is envisaged that the inventive concept is most applicable, at the present time, to transceivers used with an enhanced general packet radio system (EGPRS), a third generation (3G) system, a digital video broadcast (DVB) system, a wireless local area network (WLAN), a wireless private access network (WPAN) etc., where frequency synthesizers are typically implemented based on charge pump PLLs or voltage mode (an XOR phase detector, for example) PLLs.

Figure 5:
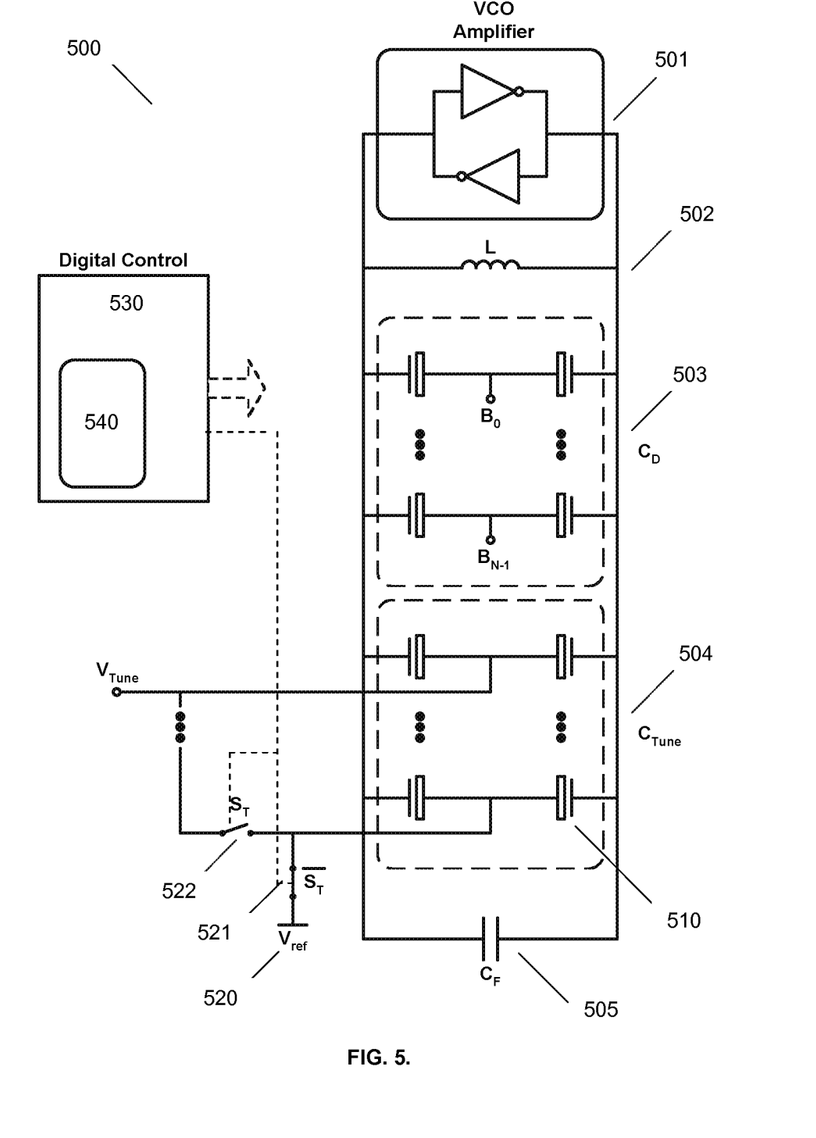
FIG. 5 illustrates a VCO implementation incorporating $K_V/N$ variation compensation and a digital controller according to one embodiment of the invention.

FIG. 5 illustrates a band-switched VCO 500 of a wireless communication device that is modified for $K_V/N$ compensation in accordance with one embodiment of the invention. The band-switched VCO 500 comprises a parallel connection of an amplifier 501, inductor 502, digitally tuned capacitor back 503, analogue tuning line voltage controlled capacitor array 504, and fixed capacitance 505. Capacitor array 504 is comprised of unit varactors 510, which may be connected by switches 522 and 521 to the tuning line voltage or a reference DC potential ($V_{ref}$) 520, respectively.

The frequency of oscillation is approximately given by:

$$\omega = \frac{1}{\sqrt{L \cdot C}} \qquad [5]$$

with $$C = C_D(\omega) + C_{Tune}(V_{Tune}) + C_F \qquad [6]$$

where:
  $C_D(\omega)$ represents the capacitance of the array of digitally controlled varactors used in band-switching,
  $C_{Tune}(V_{Tune})$ represents a capacitance of the array of varactors used for conventional PLL tuning and
  $C_F$ represents fixed capacitances in a tank circuit (for example amplifier capacitance, parasitics, loading due to subsequent elements in the frequency generation circuit and circuits using the generated frequencies).

The PLL tuning port is comprised of an array of unit element varactors, where a discussion of equations 1 and 3 above provide a definition of Kv and how variations of a Kv parameter cause variations in the denominator term of equation 1, and hence affect dynamics of loop. If the number of elements in this array is $\alpha$, the tuning port gain is given by:

$$K_V = \frac{\partial \omega}{\partial V_{dTune}} = -\frac{\omega^3 L}{2} \cdot \alpha \cdot \frac{\partial C}{\partial V_{Tune}} \qquad [7]$$

$$\Rightarrow \frac{\partial \omega}{\partial V_{Tune}} = -\frac{\omega^3 L}{2} \cdot \alpha \cdot \frac{dC_{Tune}(V_{Tune})}{dV_{Tune}}$$

Noting that $$\omega = N \cdot \omega_{ref} \qquad [8]$$

then $$\frac{K_V}{N} = -\omega^2 \cdot \frac{\omega_{ref} L}{2} \cdot \alpha \cdot \frac{dC_{Tune}(V_{Tune})}{dV_{Tune}} \qquad [9]$$

Now if $$\alpha \propto \frac{1}{\omega^2} \qquad [10]$$

then $K_V/N$, evaluated at mid range value $V_{Tune}$, is constant.

To approximate this inverse square relationship, unit elements of the tuning line varactor array are switched to provide a piecewise approximation to the ideal inverse square frequency relationship. Thus, the number of varactor elements connected to the tuning line is made a function of the frequency being synthesized, such that the resulting $K_V$ scales in proportion to the feedback divide value N thereby providing a substantially constant ratio $K_V/N$. An illustrative example design follows below to expound this concept. In particular, discrete digitally controlled steps are introduced in the known continuous analogue PLL parameter, $K_V$.

$V_{ref}$ may be chosen to position the connected varactors into a minimum capacitance region when not connected to the tuning line, for example, to maximise VCO tuning range. Also shown in FIG. 5 is a digital control block 530. The digital control block 530 sets the bits in the digitally controlled capacitor array 503 to select an optimal VCO sub-band for the frequency being synthesized. Notably, the digital control block 530 is also arranged to set the bits controlling the array of switches 521 and 522 to implement the $K_V/N$ compensation. In one embodiment of the invention, it is envisaged that optimized settings may be stored in a look up table 540, and applied before conventional band-switched PLL locking occurs, based on the desired target frequency which may be known apriori.

A design example, illustrating this concept, is as follows. Let us consider a single VCO being used to cover each of the GSM/Edge 850, 900, 1800 and 1900 MHz transmit bands. The VCO is arranged to oscillate at four times the GSM 800 and 900 MHz frequency bands, and at twice the Edge 1800 and 1900 frequency bands. Thus, the tuning range requirement from the VCO design of FIG. 4 is from 3.296 to 3.820 GHz. Design parameters are L=0.5 nH, $K_V$=50 MHz/V at 3.296 GHz, and dC/dV for a unit varactor element is −5 fF/V at a mid range value $V_{Tune}$.

Figure 6:
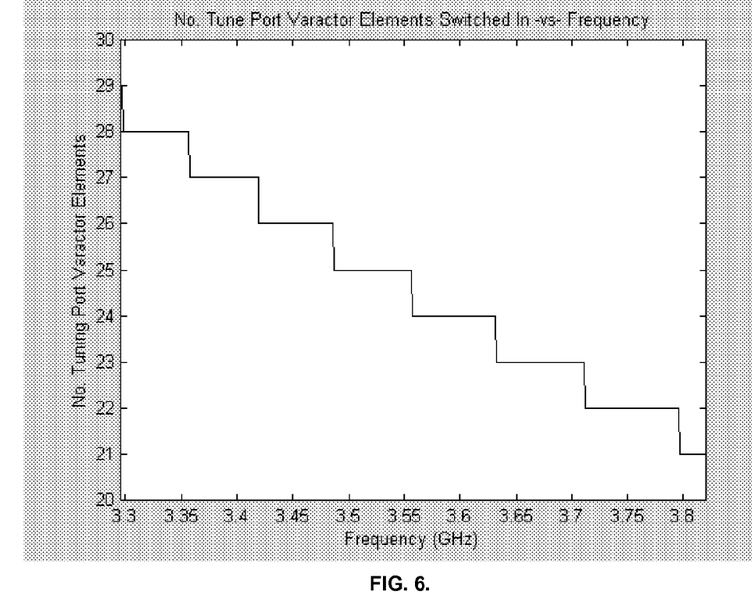
FIG. 6 illustrates a number of tuning line varactor elements switched into a tank circuit as a function of tuning frequency for $K_V/N$ compensation.

A resulting number of unit varactors switched into the tuning line array as a function of frequency is shown FIG. 6, referred to as parameter α in equation [10]. This is a piecewise approximation to the inverse-square frequency relationship over the VCO tuning range to modify $K_V$ according to equation [9] to provide a substantially constant $K_V/N$ ratio.

Figure 7:
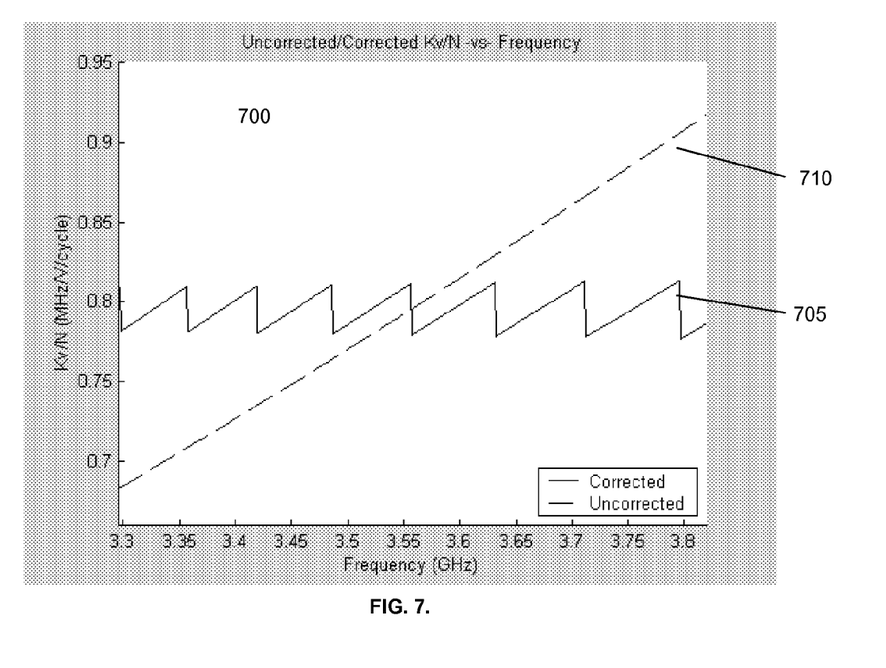
FIG. 7 illustrates $K_V/N$ variation of one embodiment of the invention compared to a known VCO.

The resulting $K_V/N$ characteristic 700 is shown in FIG. 7, where the solid trace 705 corresponds to results with the compensation scheme enabled and the dashed trace 710 corresponds to the same VCO with the compensation scheme disabled—corresponding to a conventional design. It can be seen from FIG. 7 that the variation across frequency has been substantially reduced.

Figure 8:
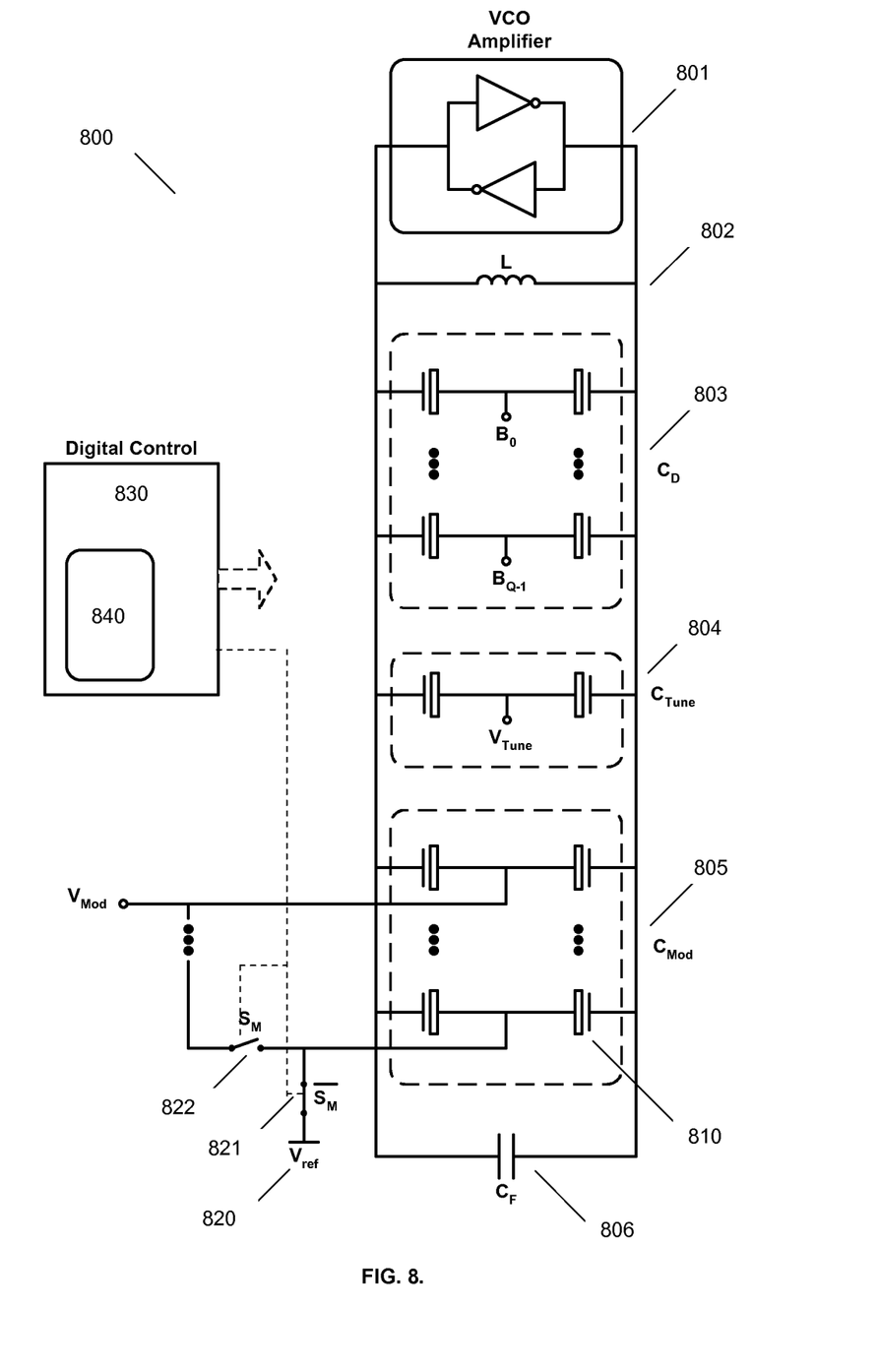
FIG. 8 illustrates a VCO implementation incorporating $K_{Mod}$ compensation and a digital controller according to one embodiment of the invention.

FIG. 8 shows an alternative embodiment of the invention, with a band-switched VCO 800 that is modified for $K_{Mod}$ compensation. The band-switched VCO 800 comprises a parallel connection of an amplifier 801, inductor 802, digitally tuned capacitor back 803, analogue tuning line voltage controlled capacitor 804, modulation capacitor array 805 and fixed capacitance 806. Capacitor array 805 is comprised of unit varactors 810, which may be connected by switches 822 and 821 to the modulation port voltage or a reference DC potential ($V_{ref}$) 820, respectively. Again, the frequency of oscillation is approximately given by:

$$\omega = \frac{1}{\sqrt{L \cdot C}} \quad [12]$$

with $$C = C_D(\omega) + C_{Tune}(V_{Tune}) + C_{Mod}(V_{Mod}) + C_F \quad [13]$$

where:
  $C_D(\omega)$ is the capacitance of the array of digitally controlled varactors used in band-switching,
  $C_{Tune}(V_{Tune})$ is the capacitance of the array of varactors used for conventional PLL tuning,
  $C_{Mod}(V_{Mod})$ is the capacitance of the array of varactors used for VCO frequency modulation, and
  $C_F$ represents fixed capacitances in a tank current (for example amplifier capacitance, parasitics, loading due to subsequent circuits, such as the feedback divider and quadrature generation circuits).

The modulation port, defined mathematically in equations [4] and [14] is comprised of an array of unit element varactors. If the number of elements in this array is β, the modulation port gain is given by:

$$K_{Mod} = \frac{\partial \omega}{\partial V_{Mod}} = -\frac{\omega^3 L}{2} \cdot \beta \cdot \frac{\partial C}{\partial V_{Mod}} \quad [14]$$

$$\Rightarrow \frac{\partial \omega}{\partial V_{Tune}} = -\frac{\omega^3 L}{2} \cdot \beta \cdot \frac{dC_{Mod}(V_{Mod})}{dV_{Mod}}$$

Now if $$\beta \propto \frac{1}{\omega^3} \quad [15]$$

then $K_{Mod}$, evaluated at mid range $V_{Mod}$ value is constant, as, if β is subbed into expression the $\omega^3$ terms cancel leaving an expression independent of frequency.

To approximate this inverse cube relationship, unit elements of the modulation varactor array are switched out according to the inverse cube frequency relationship, thus appropriately modifying $K_{Mod}$ to maintain it as a substantially constant value. In particular, discrete digitally controlled steps are introduced into the known continuous analogue PLL parameter, $K_{Mod}$. In one embodiment of the invention, $V_{ref}$ may be selected to position the connected varactors into a minimum capacitance region when not connected to the modulation port, for example, to maximise a VCO tuning range.

Also shown in FIG. 8 is a digital control block 830 which is arranged to set the bits in the digitally controlled capacitator array 803 to select the optimal VCO sub-band for the frequency being synthesized. The digital control block 830 also sets the bits controlling the array of switches 821 and 822 to implement the $K_{Mod}$ compensation. In one embodiment of the invention, optimized settings may be stored in a look-up table 840 and applied before conventional band-switched PLL locking occurs, based on the desired target frequency, which may be known apriori.

Modulation port gain is a key parameter in a transmitter incorporating such a dual port VCO, and as such requires production phasing or a calibration routine for correct modulation fidelity. Excessive $K_{Mod}$ variation may affect the production phasing and calibration algorithm execution time and convergence, and also lead to degraded system performance. This compensation scheme is intended to mitigate such issues, enhancing design robustness and product yield.

Again, to illustrate this improvement, an example of a single VCO being used to cover the GSM/Edge 850, 900, 1800 and 1900 MHz transmit bands is used, with the same design parameters as used in $K_V/N$ compensation case, with the additional constraint of $K_{Mod}$=50 MHz/V.

Figure 9:
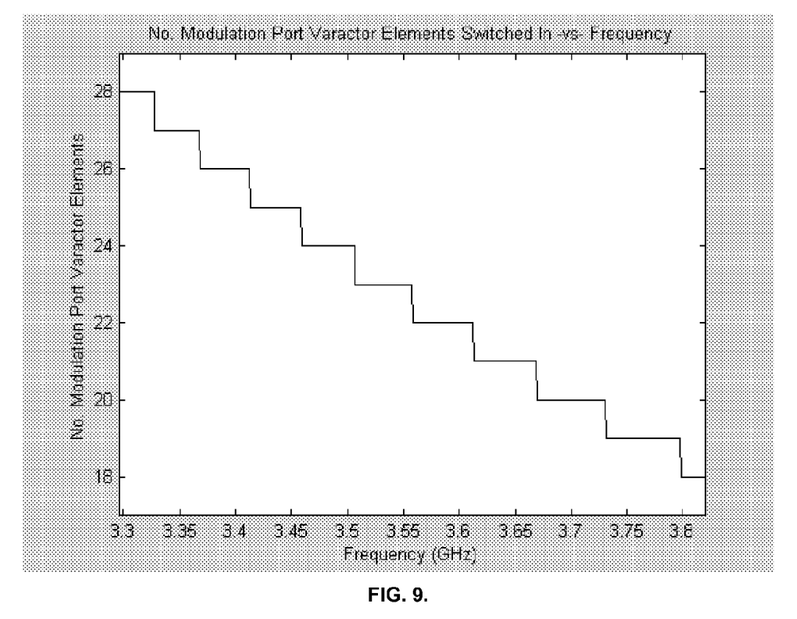
FIG. 9 illustrates a number of modulation port varactor elements switched into a tank circuit as a function of frequency for $K_{Mod}$ variation compensation.

A resulting number of unit varactors switched into the modulation port array versus frequency is shown FIG. 9. This is the parameter β in equation [15], and is a piecewise approximation to the inverse-cube frequency relationship over the VCO tuning range to modify $K_{Mod}$ according to equation [14] to provide a substantially constant $K_{Mod}$.

Figure 10:
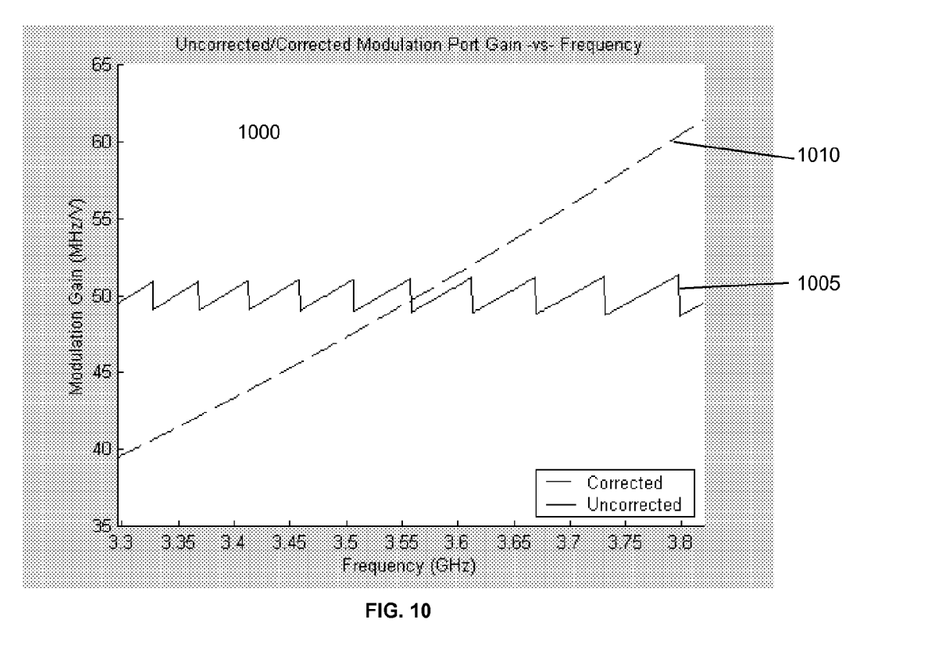
FIG. 10 illustrates $K_{Mod}$ variation of one embodiment of the invention compared to a known VCO.

The $K_{Mod}$ characteristic 1000 is shown in FIG. 10, where the solid trace 1005 corresponds to results with the compensation scheme enabled and the dashed trace 1010 corresponds to the same VCO with the compensation scheme disabled—corresponding to a conventional design. It can be seen from FIG. 10 that the variation across frequency has been substantially reduced.

Figure 11:
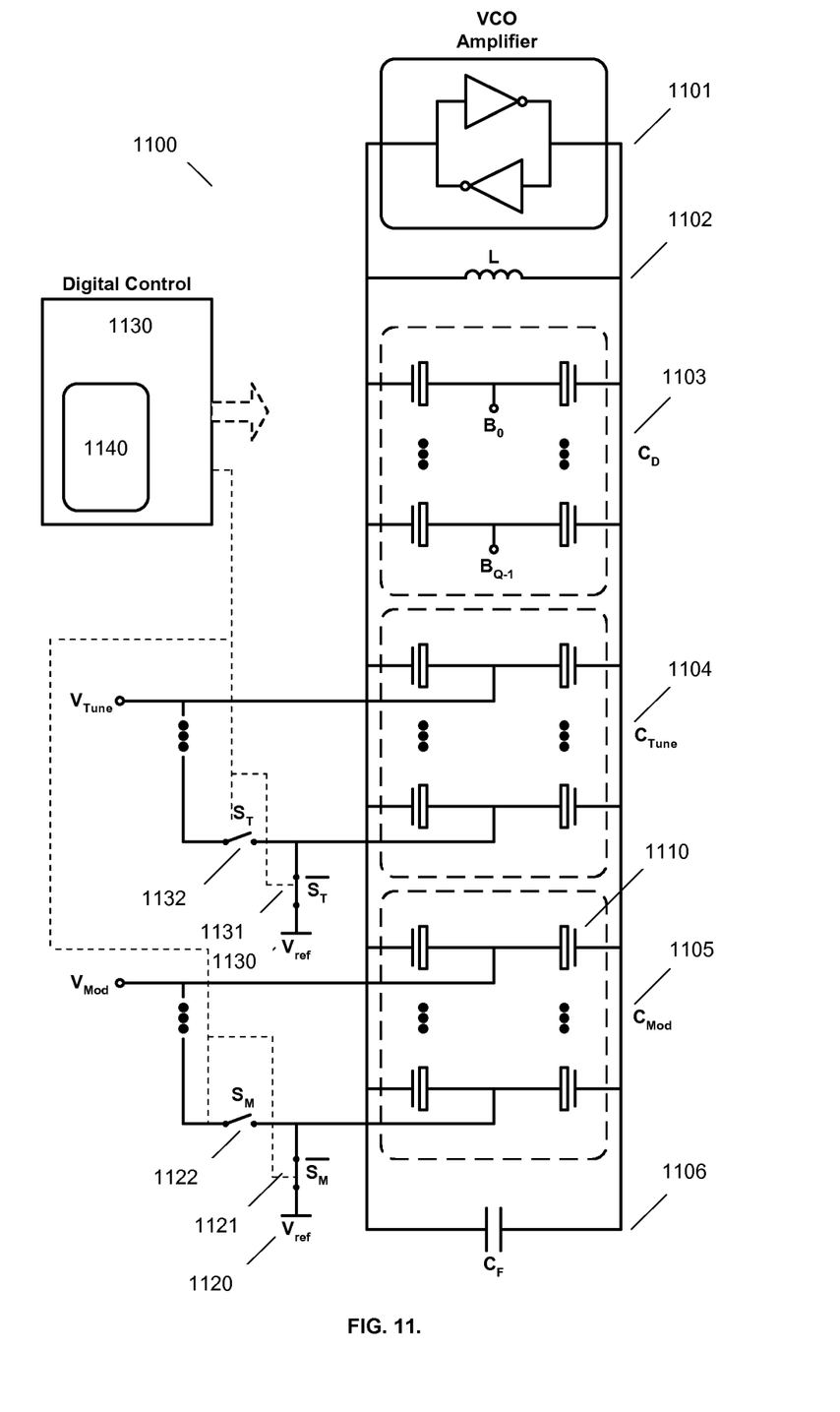
FIG. 11 illustrates a VCO implementation incorporating both $K_V/N$ and $K_{Mod}$ variation compensation according to one embodiment of the invention.

Referring now to FIG. 11 a dual port, band switched VCO 1100 is illustrated that is modified for both $K_V/N$ and $K_{Mod}$ compensation. The dual port, band-switched VCO 1000 comprised of an amplifier 1101, an inductor 1102, a digitally controlled varactor array 1103, digitally controlled analogue tuning line varactor array 1104, digitally controlled modulation varactor array 1105, and fixed capacitance 1106. Switches 1131 and 1132 along with reference potential 1130 are used in varactor array 1104 to implement $K_V/N$ compensation as described previously, and similarly switches 1121 and 1122 along with reference potential 1120 are used in varactor array 1105 to implement $K_{Mod}$ compensation. Optimal sub-band selection is achieved by digital controller 1130 and, in one embodiment of the invention, look-up table 1040 stores optimized settings for $K_V/N$ and $K_{Mod}$ compensation as a function of target frequency, as described previously.

Thus, in one embodiment of the invention, the previous described embodiments of $K_V/N$ compensation and $K_{Mod}$ compensation may be advantageously combined into a dual-port band-switched VCO design.

Thus, an improved wireless communication unit, an integrated circuit comprising a frequency generation circuit and method of operation therefor, as described above, aims to provide at least one or more of the following advantages:
(i) The inventive concept provides an improved compensation of path gain variations, such as the VCO modulation gain $K_{mod}$ variations versus frequency and $K_V/N$ variations versus frequency;
(ii) The inventive concept provides a simplification of the production phasing process of a dual port VCO.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

In particular, it is envisaged that the aforementioned inventive concept can be applied by a semiconductor manufacturer to any integrated circuit comprising a frequency generation circuit. It is further envisaged that, for example, a semiconductor manufacturer may employ the inventive concept in a design of a stand-alone device or application-specific integrated circuit (ASIC) and/or any other sub-system element.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to "a", "an", "first", "second" etc. do not preclude a plurality.

Thus, an improved wireless communication unit, integrated circuit comprising a frequency generation circuit, integrated circuit and method of operation therefor have been described, wherein the aforementioned disadvantages with prior art arrangements have been substantially alleviated.

The invention claimed is:

1. A wireless communication unit for compensating for voltage controlled oscillator modulation sensitivity variation comprises:
   a frequency generation circuit employing a phase locked loop (PLL) circuit comprising a voltage controlled oscillator having a modulation port for directly modulating a signal output from the voltage controlled oscillator, wherein the voltage controlled oscillator is operably coupled to at least one switch and a capacitor bank comprising a plurality of varactors;
   wherein the wireless communication unit comprises a controller arranged to switch in one or more varactors of the capacitor bank associated with the modulation port of the voltage controlled oscillator via the at least one switch, such that a number of varactors connected to the modulation port varies in a piecewise inverse cubic relationship with respect to a voltage controlled oscillator centre frequency, wherein the piecewise inverse cubic relationship between the number of varactors and the voltage controlled oscillator centre frequency causes a gain of the modulation port to be maintain at a substantially constant value.

2. The wireless communication unit of claim 1 wherein the controller is arranged to set a voltage to be applied to the one or more varactors to a mid-point of a modulation port tuning range.

3. The wireless communication unit of claim 1, wherein the frequency generation circuit comprises a dual-port band switched voltage controlled oscillator.

4. The wireless communication unit claim 1 further wherein a number of modulation port varactor elements are switched to a minimum capacitance state.

5. The wireless communication unit of claim 4 further wherein the number of modulation port varactor elements are switched to a minimum capacitance state at a high frequency of a voltage controlled oscillator tuning range.

6. The wireless communication unit of claim 1, wherein the wireless communication unit is a mobile phone arranged to support one or more cellular communication standards such as GSM, 3GPP, GPRS, EGPRS, EGSM.

7. An integrated circuit for compensating for voltage controlled oscillator modulation sensitivity variation comprises:
   a frequency generation circuit employing a phase locked loop (PLL) circuit comprising:
      a voltage controlled oscillator having a modulation port for directly modulating a signal output from the voltage controlled oscillator, wherein the voltage controlled oscillator is operably coupled to at least one switch and a capacitor bank comprising a plurality of varactors; and
   a controller arranged to switch in one or more varactors of the capacitor bank associated with the modulation port of the voltage controlled oscillator via the at least one switch, such that a number of varactors connected to the modulation port varies in a piecewise inverse cubic relationship with respect to a voltage controlled oscillator centre frequency, wherein the piecewise inverse cubic relationship between the number of varactors and the voltage controlled oscillator centre frequency causes a gain of the modulation port to be maintain at a substantially constant value.

8. A method of generating a radio frequency signal in a wireless communication unit employing a phase locked loop (PLL) circuit comprising a voltage controlled oscillator having a modulation port for direct modulating a signal output from the voltage controlled oscillator, the method comprising:

applying a signal to a modulation port of the phase locked loop circuit for direct modulating the signal output from the voltage controlled oscillator; and switching one or more varactors of a capacitor bank associated with the modulation port of the voltage controlled oscillator such that a number of varactors connected to the modulation port varies in a piecewise inverse cubic relationship with respect to a voltage controlled oscillator centre frequency thereby compensating for voltage controlled oscillator modulation sensitivity variation, wherein the piecewise inverse cubic relationship between the number of varactors and the voltage controlled oscillator centre frequency causes a gain of the modulation port to be maintain at a substantially constant value.

9. A wireless communication unit comprises:

a frequency generation circuit employing a phase locked loop (PLL) circuit comprising:

a voltage controlled oscillator having a tuning port for controlling a frequency of a signal output from the voltage controlled oscillator, wherein the voltage controlled oscillator is operably coupled to at least one switch and a capacitor bank comprising a plurality of varactors, wherein the PLL circuit further comprises a frequency divider in a feedback path of the PLL circuit for dividing a frequency of the voltage controlled oscillator by a number (N); and a controller arranged to switch in one or more varactors of the capacitor bank associated with the tuning port of the voltage controlled oscillator via the at least one switch, such that a number of varactors connected to the tuning port varies in a piecewise inverse square relationship with respect to a voltage controlled oscillator centre frequency, wherein the piecewise inverse cubic relationship between the number of varactors and the voltage controlled oscillator centre frequency causes a gain of the tuning port to be maintain at a substantially constant value.

10. The wireless communication unit of claim 9 further wherein the controller is arranged to set a PLL tuning line voltage applied to the one or more varactors to nominally operate around a mid-point of the PLL tuning range.

11. The wireless communication unit of claim 9 further wherein the frequency generation circuit comprises a dual-port band switched voltage controlled oscillator.

12. The wireless communication unit of claim 9 wherein a number of tuning port varactor elements are switched to a minimum capacitance state.

13. The wireless communication unit of claim 12 wherein the number of tuning port varactor elements are switched to a minimum capacitance state at a high frequency of a voltage controlled oscillator tuning range.

14. The wireless communication unit of claim 9 wherein the wireless communication unit is a mobile phone arranged to support one or more cellular communication standards such as GSM, 3GPP, GPRS, EGPRS, EGSM.

15. An integrated circuit comprising:

a frequency generation circuit employing a phase locked loop (PLL) circuit comprising:

a voltage controlled oscillator having a tuning port for controlling a frequency of a signal output from the voltage controlled oscillator wherein the voltage controlled oscillator is operably coupled to at least one switch and a capacitor bank comprising a plurality of varactors, wherein the PLL circuit further comprises a frequency divider in a feedback path of the PLL circuit for dividing a frequency of the voltage controlled oscillator by a number (N); and a controller arranged to switch in one or more varactors of the capacitor bank associated with the tuning port of the voltage controlled oscillator via the at least one switch, such that a number of varactors connected to the tuning port varies in a piecewise inverse square relationship with respect to a voltage controlled oscillator centre frequency, wherein the piecewise inverse cubic relationship between the number of varactors and the voltage controlled oscillator centre frequency causes a gain of the tuning port to be maintain at a substantially constant value.

* * * * *